US 6,617,989 B2

(12) United States Patent
Deak

(10) Patent No.: US 6,617,989 B2
(45) Date of Patent: Sep. 9, 2003

(54) RESISTOR STRING DAC WITH CURRENT SOURCE LSBS

(75) Inventor: Edward R. Deak, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/028,811

(22) Filed: Dec. 21, 2001

(65) Prior Publication Data

US 2003/0117307 A1 Jun. 26, 2003

(51) Int. Cl.[7] .............................. H03M 1/66; H03M 1/78
(52) U.S. Cl. ........................................ 341/144; 341/154
(58) Field of Search .................................. 341/144, 145, 341/154, 153, 159, 118; 708/7

(56) References Cited

U.S. PATENT DOCUMENTS

| | | | | |
|---|---|---|---|---|
| 3,857,021 A | * | 12/1974 | Wilensky et al. ............... 708/7 |
| 4,567,463 A | * | 1/1986 | Naylor ......................... 341/118 |
| 5,448,506 A | * | 9/1995 | Tateno ............................ 708/7 |
| 5,703,588 A | * | 12/1997 | Rivoir et al. ................. 341/159 |
| 5,808,576 A | | 9/1998 | Chloupek et al. ............. 341/144 |
| 5,920,273 A | * | 7/1999 | Hirano ......................... 341/144 |
| 6,225,929 B1 | * | 5/2001 | Beck ............................ 341/144 |
| 6,400,300 B1 | * | 6/2002 | Leung et al. ................. 341/154 |
| 6,433,717 B1 | * | 8/2002 | Leung ........................... 341/144 |

* cited by examiner

Primary Examiner—Jean Bruner Jeanglaude
(74) Attorney, Agent, or Firm—Ronald O. Neerings; Wade James Brady, III; Frederick J. Telecky, Jr.

(57) ABSTRACT

A method and apparatus for converting an N-bit digital word to an analog voltage signal. A first circuit converts the MSBs of the N-bit word and a second circuit converts the LSBs. The first circuit includes a resistor array in series between reference nodes and a switch matrix providing a node voltage to a first buffer input responsive to an indication of the MSBs of the N-bit word wherein the buffer output provides the analog voltage signal. The second circuit includes a current device electrically isolated from the resistors of the first circuit and coupled to a second buffer input which is further coupled in a feedback arrangement with the buffer output. The current device provides a select current whereby the resistance of the feedback loop and the select current are cooperably modify the analog voltage signal incrementally corresponding to the LSBs of the N-bit digital word.

22 Claims, 4 Drawing Sheets

RESISTOR STRING DAC WITH CURRENT SOURCE LSBS

BACKGROUND OF THE INVENTION

1. Technical Field of the Invention

The present invention relates to a digital-to-analog converter and, more particularly, to a resistor string digital-to-analog converter.

2. Description of Related Art

String digital-to-analog converters (DAC) are a type of DAC that includes a plurality of resistors connected in series between a high and low supply voltage. Connecting nodes or tap points between the resistors are selectively switched to an output node in response to the digital input. The resistor string acts as a large voltage divider with each tap point of the string being at a different voltage value. A switch matrix selects one of the tap points to the output node depending on the digital word input to the DAC. The voltage of the tap point is a monotonic analog representation of the digital input.

Referring now to FIG. 1 there is illustrated a prior art 3-bit resistor string DAC which consists of $2^3$ or 8 resistors connected in series between two reference voltages. The lower node of each resistor is selectively switched by the switch matrix to the input of the output buffer in response to a decoded digital input word. Thus, the input voltage to the output buffer is the voltage drop across the associated resistive elements of the resistor string in which the voltage drop across each resistor is VRP-VRN/8.

Generally, an N-bit resistor string DAC consists of 2 resistors and the number of switches range from $2^N$ to $2(2^N)-2$, depending on the complexity of the decoder. For example, a 10-bit DAC would require 1024 resistors and 1024 tap points with 1024 associated switches. This type of DAC, however, suffers from the spacing requirements. Because of the spacing requirement for such a large number of resistors and switches, this DAC arrangement is particularly impractical for eight bit applications and larger. Not only does the die area increase rapidly with the number of bits, but the speed is also limited by the parasitic capacitances associated with the large number of switches.

One approach to reduce the number of resistors and switches in a string DAC is described in U.S. Pat. No. 5,808,576, issued Sep. 15, 1998, entitled "Resistor String Digital-To-Analog Converter". Here, the resistor string is partitioned into a most significant bit (MSB) portion and a least significant bit (LSB) portion in which the LSB portion comprises a pair of variable resistors with one located on the top portion of the MSB portion and the other located on the lower portion of the MSB portion.

In the 576 patent, the values of the resistor bank can be shifted up or down by switching in the variable resistors. However, the variable resistors are also realized as resistor banks. Although this approach offers significant advantages over the conventional approach, a superior DAC can be realized by isolating the MSB and LSB portions and by further reducing the number of resistors and associated switches.

SUMMARY OF THE INVENTION

The present invention achieves technical advantages as a method and apparatus for converting an N-bit digital word to an analog voltage signal in which a first circuit provides for conversion of the most significant bits of the N-bit digital word and a second circuit provides for the conversion of the least significant bits. The first circuit includes an array of resistors coupled in series between reference nodes and a switch matrix for providing a node voltage to a first input of a buffer responsive to an indication of the most significant bits of the N-bit digital word in which the buffer output provides the analog voltage signal. The second circuit includes a current device electrically isolated from the resistors of the first circuit and coupled to a second input of the buffer in which the second input is coupled in a feedback arrangement with the buffer output. The current device is operable to provide a select current such that the resistance of the feedback loop and the current are cooperable to modify the analog voltage signal by an amount corresponding to the least significant bits of the N-bit digital word.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
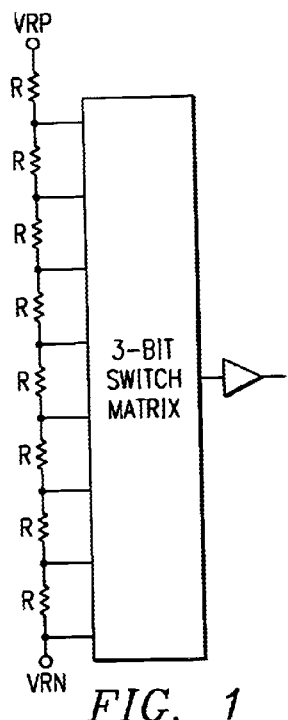
FIG. 1 illustrates a conventional string digital-to-analog converter.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

For an 8-bit resistor string DAC, prior analog architectures generally have $2^8$ elements, each one representing a bit of information. This requires 256 resistors and 256 switches in order to bring each of the associated analog outputs to an amplifier for output. A problem with this type of architecture is that such a large number of elements requires a large amount of space. One improved approach is to partition the design between two sets of different weighted elements as described in U.S. Pat. No. 5,808,576, issued Sep. 15, 1998, entitled "Resistor String Digital-To-Analog Converter", the description of which is hereby incorporated by reference.

Figure 2:
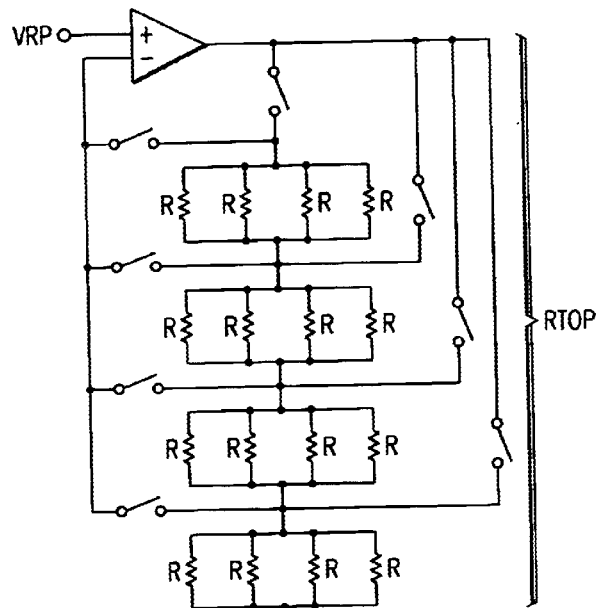
FIG. 2 illustrates another conventional string digital-to-analog converter.
Figure 2:
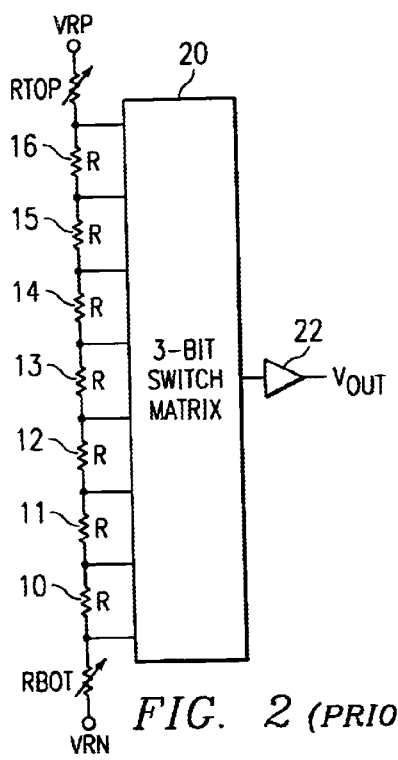

Here, as shown in FIG. 2, the resistor string is partitioned into a most-significant-bit (MSB) portion (i.e. resistor string 10–16) and a least-significant-bit (LSB) portion (i.e. variable resistors RTOP and RBOT) with reference voltages VRP and VRN applied at the ends. A switch matrix 20 selects one of the node voltages to an input of an output buffer 22. LSB elements RTOP and RBOT are operable to shift the voltage of the MSB resistor string up or down by a voltage defined by the digital bits which are mapped to their appropriate LSB segments. This is done such that the voltage difference between the top and bottom of the MSB resistor string remains constant. This shifting while maintaining constant difference is achieved by connecting an LSB segment in the RTOP (FIG. 3) at the same time one is disconnected in the RBOT (or vice versa), thus maintaining a constant total resistance for all digital codes.

Figure 3:
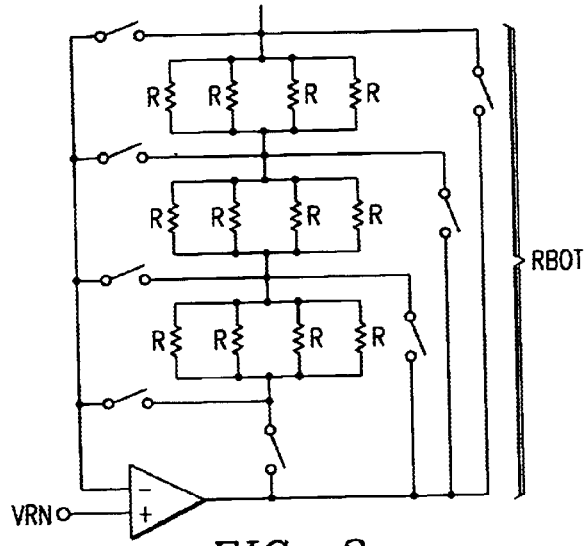
FIG. 3 illustrates the LSB resistor banks of the conventional string digital-to-analog converter illustrated in FIG. 2.

LSB elements RTOP and RBOT are realized as respective resistor banks, as shown in the 576 patent and reproduced here as FIG. 3. With this described approach, the number of resistors used in the DAC can be reduced to less than half of prior designs. However, with this approach, only one of the LSB elements RTOP and RBOT are used at any one time while the other one sits with no effect.

An improved DAC can be realized by eliminating the resistors of the LSB elements RTOP and RBOT and the associated switches. For example, in an 8-bit DAC with a 5–3 partitioned architecture (i.e. 5 MSB weighted bits and 3 LSB weighted bits) generally includes 56 unit resistors and switches in the LSB resistor banks. The switches in the ground signal path in these resistor banks arrangements tend to be large to minimize associated thermal drift problems. The resistors of LSB elements RTOP and RBOT are eliminated in accordance with an embodiment of the present invention, without sacrificing resolution, by adjusting the voltage of the output amplifier via a controlled current. In accordance with the present invention, switches are eliminated in the resistor path between voltage reference and ground altogether, completely eliminating their contribution to drift over temperature. In the past, the ground side switches have been NMOSFETS as large as 100 μm wide and 0.8 μm long.

Figure 4:
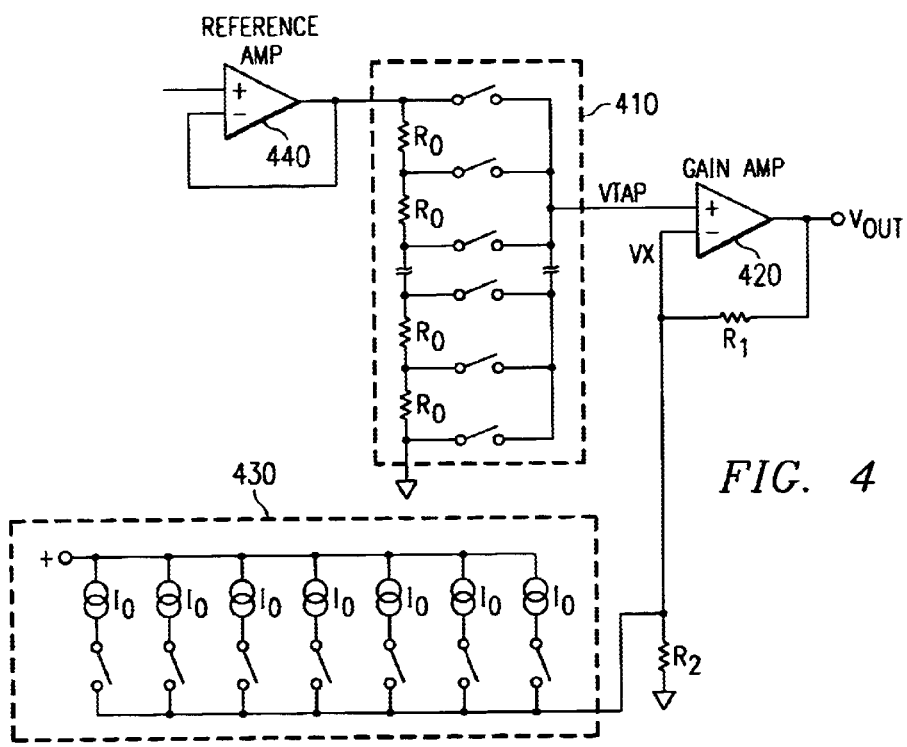
FIG. 4 illustrates a resistor string DAC in accordance with an exemplary embodiment of the present invention.
Figure 6A:
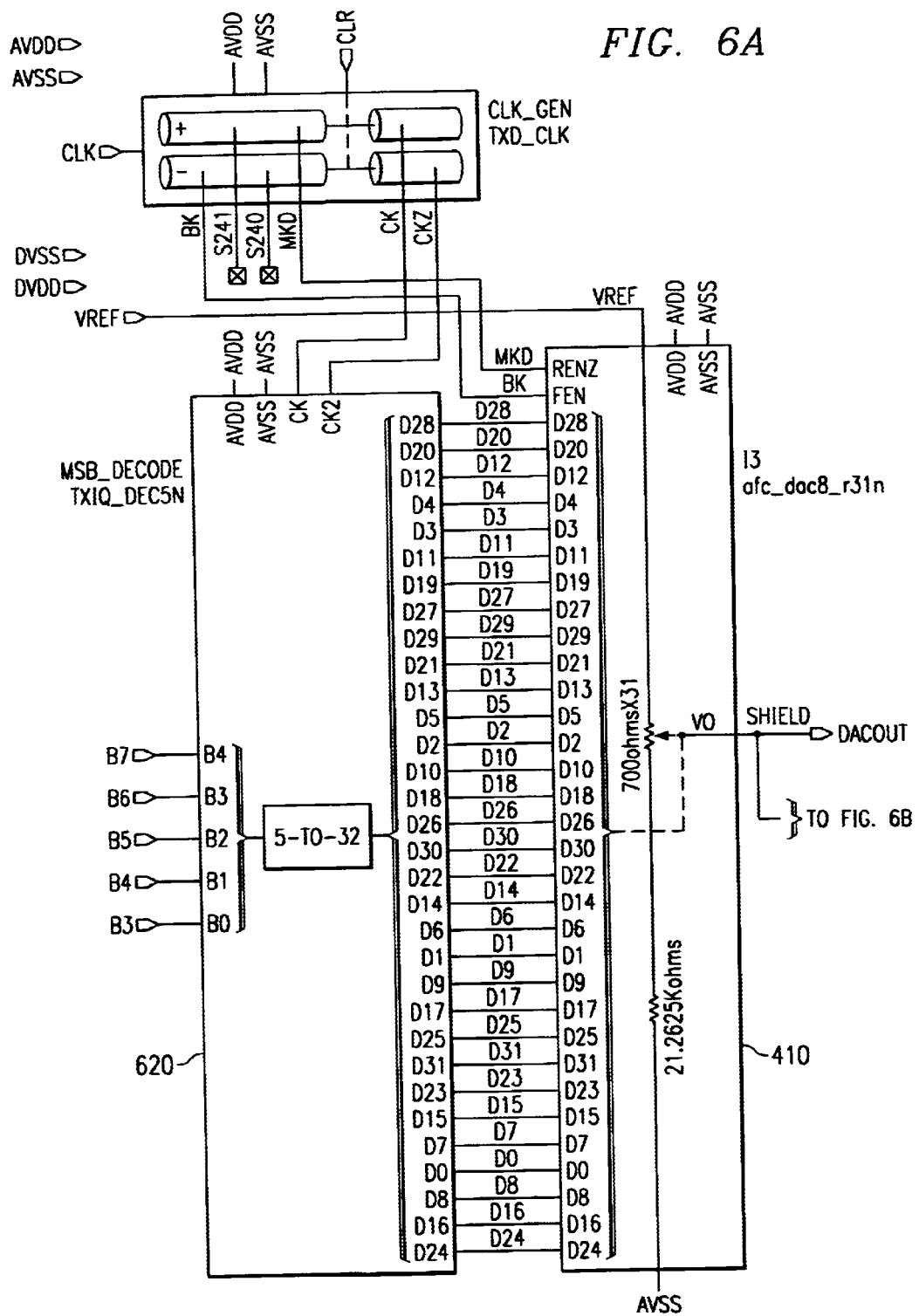
FIGS. 6A and 6B illustrate[s] an electrical schematic for an 8-bit DAC in accordance with an exemplary embodiment of the present invention.
Figure 6B:
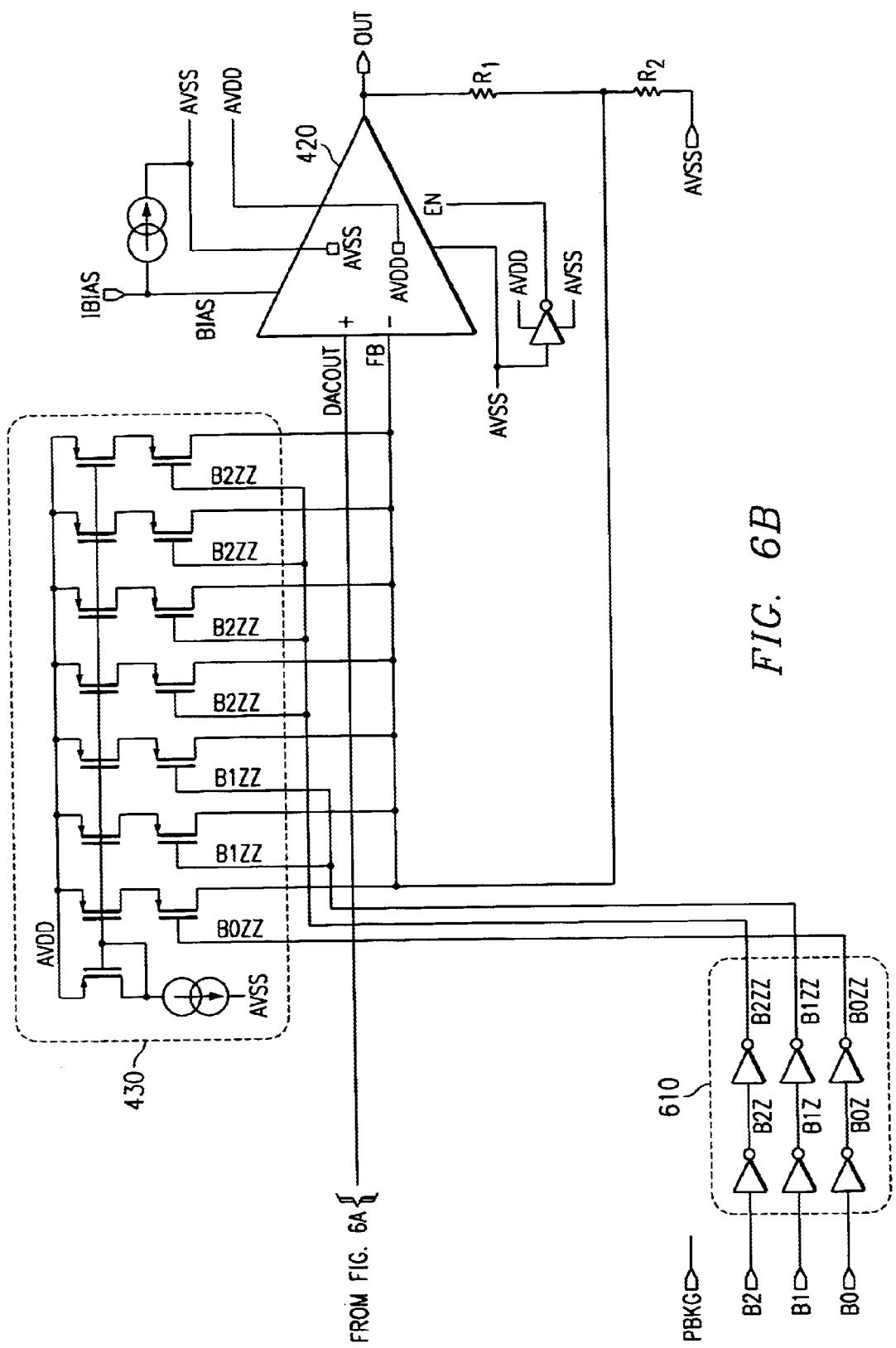

Referring now to FIG. 4 there is illustrated a modified partitioned resistor string DAC in accordance with an exemplary embodiment of the present invention. The LSB portion (i.e. current device 430) of the DAC is electrically separated or isolated from the MSB portion (i.e. resistor string 410) in which the gain amplifier 420 (output buffer) enables sensing of the tapped voltage from the MSB resistor string 410 for application of a corresponding output without drawing current from any of the resistors. The MSB resistor string 410 also includes a switch matrix for selecting the appropriate voltage. In addition, the MSB resistor string 410 can include a decoder 620 (see FIGS. 6A and 6B) for selecting the appropriate switches responsive to a signal indicative of the most significant bits of the digital word.

A positive terminal of the gain amplifier 420 is coupled to the MSB resistor string tap ($V_{TAP}$), and resistors $R_1$ and $R_2$ enable feedback around the amplifier 420. $R_1$ is connected between the output ($V_{OUT}$) and the negative input ($V_X$) of the amplifier 420. $R_2$ is connected between $V_X$ and electrical ground and current device 430 is coupled to $V_X$. It is worth noting that the 576 patent and other conventional approaches do not use the negative terminal for conversion of the digital signal.

Current device 430 is operable to enable the LSB process of the differential in the analog conversion by controllably forcing current into or out of $V_X$ advantageously adjusting $V_{OUT}$ for each MSB resistor tap. Current device 430 receives a signal indicative of the LSBs of an N-bit digital word to be converted and, in response, applies a corresponding current into the feedback loop of the output amplifier. Further, current device 430 comprises a number of current sources ($I_0$) coupled in parallel and connected to a positive supply in which the current sources $I_0$ are either switched in or switched out to node $V_X$. The switches for the current sources (see item 430 of FIGS. 4, [and] 6A and 6B) switch current into a virtual ground, and their resistance effect is negligible. In one embodiment of the present invention, these switched are PMOSFETS which are 2 μm wide and 0.4 μm long. Current device 430 can also include a decoder circuit 610 (see FIGS. 6A and 6B) for selecting current sources $I_0$ responsive to the LSB signal.

In accordance with the present invention, an 8-bit partitioned DAC, for example, has 3-bits assigned to the LSB portion and at least $2^L-1$ corresponding current sources $I_0$ in which L is the number of bits assigned to the LSB portion of the DAC. Thus, $2^3-1$ or 7 current sources $I_0$ are used in this 8-bit DAC. The current sources $I_0$ can include MOS devices and, more particularly, PMOS devices (see FIGS. 6A and 6B). PMOS devices and their associated switches are small compared to resistor elements and their associated switches.

The current sources $I_0$ are matched, in other words, the current sources each provide an approximately equal amount of current ($I_{LSB}$). The value of $I_{LSB}$ and $R_1$ are chosen such that the current from one source passing through resistor $R_1$ equals an LSB of voltage change. For the 5–3 partitioned 8-bit DAC, $I_{LSB} \times R_1 = $LSB which is approximately equal to ⅛ th the drop across an MSB resistor ($R_0$). The ratio of R1 and (R1+R2) form the feedback factor found in classic control theory. The closed loop gain of the amplifier in this non-inverting configuration is 1+R1/R2 as can be found in current textbooks on electronic design.

Assuming the voltage at $V_{TAP}$ is equal to $V_X$, which is the standard assumption made for a high gain amplifier such as amplifier 420, the closed form expression for Vout can be calculated as follows:

$$V_{TAP} = V_X,$$

$$\frac{V_{OUT} - V_X}{R_1} + I_{LSB} = \frac{V_X}{R_2},$$

$$\frac{V_{OUT} - V_{TAP}}{R_1} + I_{LSB} = \frac{V_{TAP}}{R_2},$$

$$V_{OUT} - V_{TAP} + R_1 I_{LSB} = \frac{R_1}{R_2} V_{TAP},$$

$$V_{OUT} + R_1 I_{LSB} = \left(\frac{R_1}{R_2} + 1\right) V_{TAP}, \text{ where}$$

$$V_{OUT} = \left(\frac{R_1}{R_2} + 1\right) V_{TAP} - R_1 I_{LSB}.$$

Further, because the reference amplifier is not isolated from the LSB switching in the prior string DACs, it suffers from transient load changes during switching, which limits code transition speed and DAC settling. With the present design, the reference amplifier 440 is completely isolated from the LSB switching of current device 430 because currents are injected into the negative feedback node $V_X$ of the gain amplifier 420 rather than through any resistors that are seen in the output path of the reference amplifier 440.

Figure 5:
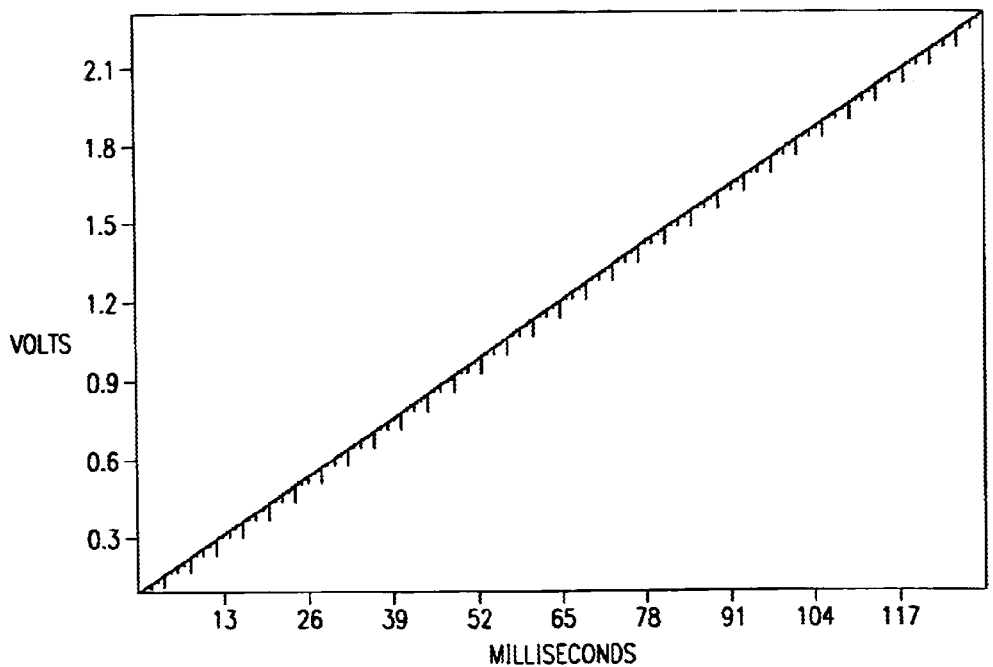
FIG. 5 illustrates a graph of simulated results for the DAC illustrated in FIG. 4.

Referring now to FIG. 5 there is shown a graphical representation of simulated results for the 8-bit DAC. As the digital input code is changed over time, an analog waveform is received at the output. The analog waveform is plotted on the Y-axis and labeled "volts". Since the digital code is changed as a function of time, the X-axis, rather than representing digital code, is labeled time and in this case milliseconds. A DAC with good characteristics should exhibit a linear sweep at the output for a linear sweep of the digital code at the input. FIG. 5 generally illustrates that the analog output corresponds to approximately a 1-for-1 output with the digital input.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A device for converting an N-bit digital word to an analog voltage signal, comprising:
    a first circuit providing for supporting conversion of most significant bits of said N-bit digital word and comprising a switch matrix coupled to an array of resistors connected in series between reference voltages and operable to switch a voltage of said array of resistors to an output responsive to an indication of said most significant bits;
    a buffer having a first input coupled to said switch matrix output and a second input coupled in a feedback loop with an output of said buffer, said buffer output provides said analog voltage signal; and
    a second circuit for supporting conversion of least significant bits of said N-bit digital word, said second circuit comprising:
        an active circuit device having an input for receiving an indication of said least significant bits and an output coupled to said second input of said buffer, said active circuit device cooperable with said feedback loop for modifying said analog voltage signal by a voltage amount corresponding to said least significant bits.

2. The device of claim 1, wherein said first circuit and said second circuit are electrically isolated from one another.

3. The device of claim 1, wherein said active circuit device is a current device that includes a plurality of current sources connected in parallel and each operable to produce a current (I) in said feedback loop.

4. The device of claim 3, wherein said feedback loop comprises a resistance (R), and wherein I times R represents a maximum voltage resolution of said analog voltage signal.

5. The device of claim 4, wherein said current device further includes a further switch matrix coupled to said plurality of current sources and operable to switch said current from a selected number of said current sources to said feedback loop.

6. The device of claim 5, wherein said first circuit and said second circuit are electrically isolated from one another.

7. The device of claim 3, wherein said plurality of current sources respectively comprise metal oxide semiconductor devices.

8. The device of claim 3, wherein said current device further includes a further switch matrix coupled to said plurality of current sources and operable to switch said current from a selected number of said current sources to said feedback loop.

9. The device of claim 8, including a decoder coupled to said further switch matrix for controlling said further switch matrix in response to information indicative of said least significant bits.

10. The device of claim 1 further comprising a resistor coupled between said feedback loop and a voltage reference.

11. The device of claim 1, wherein said active current device comprises $2^L-1$ current sources connected in parallel and each operable to produce a current (I) in said feedback loop, and wherein L is a number of least significant bits associated with said second circuit.

12. The device of claim 1, wherein said buffer is a gain amplifier.

13. A device for converting a digital word to an analog voltage signal, comprising:
    an amplifier having first and second inputs and having an output for providing said analog voltage signal;
    a circuit coupled to said first input for providing at said first input a voltage indicative of a plurality of most significant bits of said digital word;
    a feedback path coupled between said output and said second input;
    an active circuit device coupled to said second input and cooperable with said feedback path for modifying said analog voltage signal by a voltage amount corresponding to a plurality of least significant bits of said digital word.

14. The device of claim 13, wherein said active circuit device is a current device.

15. The device of claim 14, wherein said current device includes a plurality of current sources connected in parallel, each of said current sources operable to produce a current in said feedback path.

16. The device of claim 15, wherein said feedback path includes a resistance, and wherein said current multiplied by said resistance represents a maximum voltage resolution of said analog voltage signal.

17. The device of claim 16, wherein said current device further includes a switch matrix coupled to said plurality of current sources and operable to switch said current from a selected number of said current devices to said feedback path.

18. The device of claim 15, wherein said plurality of current sources respectively comprise metal oxide semiconductor devices.

19. The device of claim 13, wherein said circuit and said active circuit device are isolated from one another.

20. A method for converting a digital word to an analog voltage signal comprising:
    providing said analog voltage signal at an output of an amplifier;
    providing at a first input of said amplifier a voltage indicative of a plurality of most significant bits of said digital word;
    modifying said analog voltage signal by a voltage amount that corresponds to a plurality of least significant bits of said digital word, including using an active circuit device to drive a second input of said amplifier that is coupled to said output of said amplifier by a feedback path.

21. The method of claim 20, wherein said using step includes producing at least a first amount of current in said feedback path.

22. The method of claim 21, wherein said using step includes producing in said feedback path a second amount of current that is approximately equal to an integer multiple of said first amount of current.

* * * * *